(12) United States Patent
Seko

(10) Patent No.: US 8,581,284 B2
(45) Date of Patent: *Nov. 12, 2013

(54) SEMICONDUCTOR LIGHT-EMITTING DEVICE AND MANUFACTURING METHOD

(75) Inventor: Toshihiro Seko, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 274 days.

This patent is subject to a terminal disclaimer.

(21) Appl. No.: 13/070,707

(22) Filed: Mar. 24, 2011

(65) Prior Publication Data

US 2011/0235355 A1   Sep. 29, 2011

(30) Foreign Application Priority Data

Mar. 24, 2010  (JP) .................................. 2010-068088

(51) Int. Cl.
*H01L 33/00* (2010.01)

(52) U.S. Cl.
USPC .................. 257/98; 257/79; 257/99; 257/100; 257/E33.072; 313/485; 313/501; 362/231; 362/243; 362/555; 438/22; 438/28

(58) Field of Classification Search
USPC ............ 362/545, 547, 249.02, 294, 538, 243; 257/E33.072, 98, E33.061, E33.064, 257/E33.067, 79, 99, 100; 438/22, 27, 28; 313/485, 501
See application file for complete search history.

(56) References Cited

U.S. PATENT DOCUMENTS

| 7,520,647 B2 | 4/2009 | Tachibana |
| 8,115,217 B2 * | 2/2012 | Duong et al. ................... 257/88 |
| 2002/0018885 A1 | 2/2002 | Takahashi et al. |
| 2011/0309388 A1 * | 12/2011 | Ito et al. .......................... 257/89 |

FOREIGN PATENT DOCUMENTS

| JP | 2000-63873 A | 2/2000 |
| JP | 2009-218274 A | 9/2009 |

* cited by examiner

*Primary Examiner* — John A Ward
(74) *Attorney, Agent, or Firm* — Kenealy Vaidya LLP

(57) ABSTRACT

A semiconductor light-emitting device and a method for manufacturing the same can include a wavelength converting layer encapsulating at least one semiconductor light-emitting chip in order to emit various colored lights including white light. The semiconductor light-emitting device can include a base board, a frame located on the base board, the chip mounted on the base board, the wavelength converting layer formed around the chip, a transparent plate located on the wavelength converting layer and a diffusing reflection member disposed between the frame and both side surfaces of the wavelength converting layer and the transparent plate. The device can be configured to improve the linearity of a boundary between the diffusing reflection member and both side surfaces by using the transparent plate, and therefore can be used for a headlight that can form a favorable horizontal cut-off line corresponding to the boundary via a projector lens without a shade.

20 Claims, 10 Drawing Sheets

SEMICONDUCTOR LIGHT-EMITTING DEVICE AND MANUFACTURING METHOD

This application claims the priority benefit under 35 U.S.C. §119 of Japanese Patent Application No. 2010-068088 filed on Mar. 24, 2010, which is hereby incorporated in its entirety by reference.

BACKGROUND

1. Field

The presently disclosed subject matter relates to semiconductor light-emitting devices including a semiconductor light-emitting chip and to manufacturing methods for the same, and more particularly, to semiconductor light-emitting devices for a vehicle light, for example a headlight, that can provide a favorable horizontal cut-off line for a low beam without a shade, and to methods of manufacturing such devices.

2. Description of the Related Art

Semiconductor light-emitting devices that include an LED chip have been used for vehicle headlights in recent years. Vehicle headlights can be classified into two major groups, a reflector type and a projector type. A conventional LED light source using a plurality of LED chips and a vehicle lamp using the light source, for example, are disclosed in Patent Document No. 1 (U.S. Pat. No. 7,520,647 (commonly assigned)). The conventional LED light source disclosed in Patent Document No. 1 can be used as a light source for a reflector type headlight.

When the conventional LED light source is used for a vehicle headlight, the headlight forms a light distribution pattern by reflecting light emitted from the LED light source by a reflector. When a light distribution pattern for a low beam is formed by the LED light source and the reflector, the vehicle headlight may form the light distribution pattern including a horizontal cut-off line by shielding an upward light that gives a glaring type light to an oncoming vehicle and the like by using a shade.

A semiconductor light-emitting device using a plurality of LED chips can also be used as a light source for a projector type headlight and is disclosed in Patent Document No. 2 (Japanese Patent Application Laid Open JP2009-218274). FIG. 8 is a top view showing the conventional semiconductor light-emitting device disclosed in Patent Document No. 2. FIG. 9 is a cross-section view depicting the conventional semiconductor light-emitting device taken along line B-B shown in FIG. 8, and FIG. 10 is a partial close-up cross-section view depicting a principal portion of the semiconductor light-emitting device of FIG. 9.

The conventional semiconductor light-emitting device 60 includes: a base board 50; semiconductor light-emitting chips 51 mounted on the base board 50; a wavelength converting layer 52 formed around the semiconductor light-emitting chips 51 by a stencil printing method and the like so as to encapsulate the semiconductor light-emitting chips 51 along with the base board 50; a frame 58 located on the base board so as to surround the wavelength converting layer 52 encapsulating the semiconductor light-emitting chips 51; and a reflecting member 54 located between the wavelength converting layer 52 and the frame 58 while tightly contacting with a side surface 53 of the wavelength converting layer 52, and the reflecting member 54 made by mixing a diffusing material such as titanium oxide, aluminum oxide and the like with a transparent resin.

A difference between the semiconductor light-emitting device 60 and the above-described conventional LED light source used for the reflector type headlight relates to the reflecting member 54. The conventional LED light source may not include the reflecting member 54 described later because the shade may shield the upward light that emits a glaring type light to an oncoming vehicle, etc.

When the semiconductor light-emitting device 60 is used as a light source for a vehicle headlight, the vehicle headlight may form a light distribution pattern for a low beam via a projector lens. In this case, a boundary 55 between the wavelength converting layer 52 and the reflecting member 54 may form a horizontal cut-off line in the light distribution pattern for a low beam via the projector lens. Accordingly, the semiconductor light-emitting device 60 is located in the vehicle headlight along with the projector lens so that the side surface 53 of the wavelength converting layer 52 corresponding to the boundary 55 can project the horizontal cut-off line of the light distribution pattern.

However, it may be difficult for the semiconductor light-emitting device 60 to provide the side surface 53 of the wavelength converting layer 52 on the same surface as the boundary 55 between the wavelength converting layer 52 and the reflecting member 54 as shown in FIG. 9. That is because a curved surface 56 and/or a concave-convex surface 57 may exist near the boundary 55 between the wavelength converting layer 52 and the reflecting member 54 due to deformation of the wavelength converting layer 52 which may occur during formation of the wavelength converting layer 52 as shown in FIG. 10.

Therefore, the boundary 55 between the wavelength converting layer 52 and the reflecting member 54 is subject to deformation of the curved surface 56 and/or the concave-convex surface 57 as shown in a close-up view in the circle of FIG. 8. Thus, it is difficult for the reflecting member 54 to maintain a linear e boundary 55 between the wavelength converting layer 52 and the reflecting member 54, which projects the horizontal cut-off line for a low beam via the projector lens.

The reflecting member 54 includes a reflective filler having fluidity due to a low viscosity, and is filled in a space between the wavelength converting layer 52 encapsulating the semiconductor light-emitting chips 51 and the frame 58 located on the base board 50. Accordingly, the reflecting member 54 may be in close contact with the side surface 53 of the wavelength converting layer 52 so as to wholly cover the side surface 53 of the wavelength converting layer 52 therewith.

In this case, when the reflecting member 54 having a low viscosity is injected into the space between the wavelength converting layer 52 and the frame 58 in a developmental state of the deformation at a top edge portion of the wavelength converting layer 52 as described above, the reflecting member 54 that reaches to the top edge portion of the wavelength converting layer 52 may rise on the curved surface 56 and/or the concave-convex surface 57, which is developed at the top edge portion of the wavelength converting layer 52.

The reflecting member 54 that reaches the curved surface 56 and/or the concave-convex surface 57 at the top edge portion of the wavelength converting layer 52 may interrupt light-emission of the semiconductor light-emitting chips 51 from the wavelength converting layer 52 toward the outside of the light emitting device 60, and may cause a reduction of a beam flux of light emitted from the semiconductor light-emitting device 60. Additionally, the reflecting member 54 that reaches the curved surface 56 and/or the concave-convex surface 57 of the wavelength converting layer 52 may cause a reduction of characteristics of the horizontal cut-off line for a low beam because the linear nature of the boundary 55 between the wavelength converting layer 52 and the reflecting member 54 that forms the horizontal cut-off line beam reduces.

The horizontal cut-off line of the light distribution pattern for a low beam is formed by a light blocking effect of the reflecting member 54. The light blocking effect of the reflecting member 54 is due to a feature that diffuses incoming light entering into the reflecting member 54 with the diffusing material such as the titan oxide, etc. The reflecting member 54 has a high reflectivity and diffusibility, however, part of the incoming light entering into the reflecting member 54 may slightly leak as a diffusing light to the outside because of diffusing reflection.

The amount of diffusing light that leaks from the reflecting member 54 to the outside may be determined by a thickness of the reflecting member 54 and a density of the diffusing material in the reflecting member 54. The characteristics of the horizontal cut-off line may be determined by a ratio of a light intensity of light emitted from the wavelength converting layer 52 and a light intensity of the diffusing light leaked from the reflecting member 54 and by a shape of the boundary 55 between the wavelength converting layer 52 and the reflecting member 54.

In this case, the smaller the ratio of the light intensity of the light emitted from the wavelength converting layer 52 and the light intensity of the diffusing light leaked from the reflecting member 54, the sharper the horizontal cut-off line is, because a difference in the light intensity in the boundary 55 between the wavelength converting layer 52 and the reflecting member 54 is large.

When the top edge portion of the wavelength converting layer 52 is curved, because the reflecting member 54 covers the top edge portion of the wavelength converting layer 52 as shown in FIG. 10, the light-emitting region of the wavelength converting layer 52 is reduced. In addition, because a thickness of the reflecting member 54 near the boundary 55 between the wavelength converting layer 52 and the reflecting member 54 becomes thin, the light blocking effect is reduced near the boundary 55. Consequently, the characteristics of the horizontal cut-off line degrade, especially in regard to the linearity of the horizontal cut-off line and a contrast between a top and bottom of the horizontal cut-off line.

When the density of the diffusing material in the reflecting member 54 is high density in order to enhance the light blocking effect of the reflecting member 54, adhesions between the reflecting member 54 and the wavelength converting layer 52 and between the reflecting member 54 and the frame 58 may be reduced because a density of the transparent resin having an adhesivity in the reflecting member 54 is reduced.

Therefore, the density of the diffusing material with respect to the transparent resin should be maintained at an effectual value in order to manufacture the semiconductor light emitting device 60 so as to have high reliability. Moreover, in order to form a favorable horizontal cut-off line, one can form the wavelength converting layer 52 from the top edge portion to a bottom edge portion so that the side surface 53 of the wavelength converting layer 52 becomes substantially perpendicular to the base board 53.

However, in a process for forming the wavelength converting layer 52, it may be difficult to form the side surface 53 of the wavelength converting layer 52 from the top edge portion to the bottom portion in a plane perpendicular to the base board 53. Thus, it may be difficult for the conventional semiconductor light-emitting device 60 to provide a favorable horizontal cut-off line for a low beam.

In the above-described LED light source used for the reflector type headlight, the reflecting member 54 may not be required. However, the reflector and the shade for forming the horizontal cut-off line are required to provide a headlight having a favorable light distribution pattern. Therefore, the reflector type headlight may become large in size as compared with the projector type headlight.

The above-referenced Patent Documents are listed below, and are hereby incorporated with their English abstracts in their entireties.
1. Patent Document No. 1: U.S. Pat. No. 7,520,647
2. Patent Document No. 2: Japanese Patent Application Laid Open JP2009-218274

The disclosed subject matter has been devised to consider the above and other problems, features, and characteristics. Thus, embodiments of the disclosed subject matter can include semiconductor light-emitting devices that can form a favorable horizontal cut-off line for a low beam, and associated manufacturing methods that do not cause and/or are designed to prevent some of the above-described problems, concerns, and characteristics related to a wavelength converting layer. The disclosed subject matter can also include a projector type headlight for a low beam using the semiconductor light-emitting device that can form the favorable horizontal cut-off line without a shade.

SUMMARY

The presently disclosed subject matter has been devised in view of the above and other problems, features, and characteristics. An aspect of the disclosed subject matter includes methods of manufacture that provide semiconductor light-emitting devices used for a projector type headlight having a favorable light distribution pattern for a low beam without a shade and a reflector and which can provide a similar lead time while using a similar manufacture machine in comparison with conventional semiconductor light-emitting devices and processes.

According to an aspect of the disclosed subject matter, a semiconductor light-emitting device can include: a base board having conductor patterns formed on a mounting surface thereof; at least one semiconductor light-emitting chip including chip electrodes that are electrically connected to respective conductor patterns of the base board; a wavelength converting layer including at least one phosphor in a transparent resin and disposed around the at least one semiconductor light-emitting chip; a transparent plate having an incoming surface and an outgoing surface located on the wavelength converting layer while the incoming surface contacts with the wavelength converting layer, a side surface thereof being substantially the same level as a side surface of the wavelength converting layer (that is, substantially aligned with the side surface of the wavelength converting layer) and being substantially perpendicular to the mounting surface of the base board; and a frame located on the mounting surface of the base board so as to surround the wavelength converting layer and the transparent plate.

Additionally, the semiconductor light-emitting device can include a diffusing reflection member located between the frame and both side surfaces of the wavelength converting layer and the transparent plate, wherein a top surface thereof becomes the substantially same level as the outgoing surface of the wavelength converting layer (that is, substantially aligned with the outgoing surface of the wavelength converting layer). In this case, the device can further include a transparent adhesive layer located between the wavelength converting layer and the transparent plate, wherein a side surface thereof is formed at the substantially same level (i.e., aligned with) as both side surfaces of the wavelength converting layer and the transparent plate.

In the above-described exemplary semiconductor light-emitting device, the at least one semiconductor light-emitting chip can be a blue light-emitting chip and the at least one phosphor of the wavelength converting layer can be selected from the group consisting of a yellow phosphor, and two phosphors including a red phosphor layer and a green phosphor layer. The at least one semiconductor light-emitting chip can be also an ultraviolet light-emitting chip and also the at least one phosphor of wavelength converting layer can include at least one of a red phosphor, a green phosphor and a blue phosphor. The transparent plate can be made of a glass, and a thickness thereof can be 0.2 millimeters or less. Additionally, the transparent resin of the wavelength converting layer and the transparent adhesive layer can include a silicone resin. At least one of the incoming surface and the outgoing surface of the transparent plate can also be configured with a microstructure to diffuse light emitted from the at least one semiconductor light-emitting chip.

According to the above-described exemplary semiconductor light-emitting device, the device can prevent a deformation caused at a top edge portion in a process for forming the wavelength converting layer and can improve the linearity of a boundary between the wavelength converting layer and the diffusing reflection member, which forms a horizontal cut-off line for a low beam. Furthermore, a vehicle headlight including the device can include a projector lens in front of the device so that the outgoing surface of the transparent plate and the top surface of the diffusing reflection member can face the projector lens. Thus, the disclosed subject matter can provide a semiconductor light-emitting device that can be used for a vehicle headlight having a favorable light distribution pattern for a low beam, which can be formed in high linearity and a high contrast.

Another aspect of the disclosed subject matter includes methods for manufacturing the above-described semiconductor light-emitting devices. An exemplary method can include: providing the base board; connecting each of the chip electrodes of the at least one semiconductor light-emitting chip to the respective conductor patterns of the base board; forming the wavelength converting layer around the at least one semiconductor light-emitting chip; mounting the transparent plate on the transparent adhesive layer; and disposing the diffusing reflection member between the frame and the side surfaces of the wavelength converting layer, the transparent adhesive layer and the transparent plate.

In the above-described exemplary method for manufacturing semiconductor light-emitting devices, a process for forming the transparent adhesive layer can be abbreviated by directly attaching the transparent plate on the wavelength converting layer. In addition, the same or similar variations of the device can also be employed as set forth above.

According to the exemplary manufacturing method described above for the semiconductor light-emitting devices, the transparent plate can be attached on the wavelength converting layer using its own weight by placing it on the transparent adhesive layer. The wavelength converting layer and the diffusing reflection member can be solidified by a similar method as compared to conventional processes. Thus, the method can provide reliable semiconductor light-emitting devices used for a vehicle headlight using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
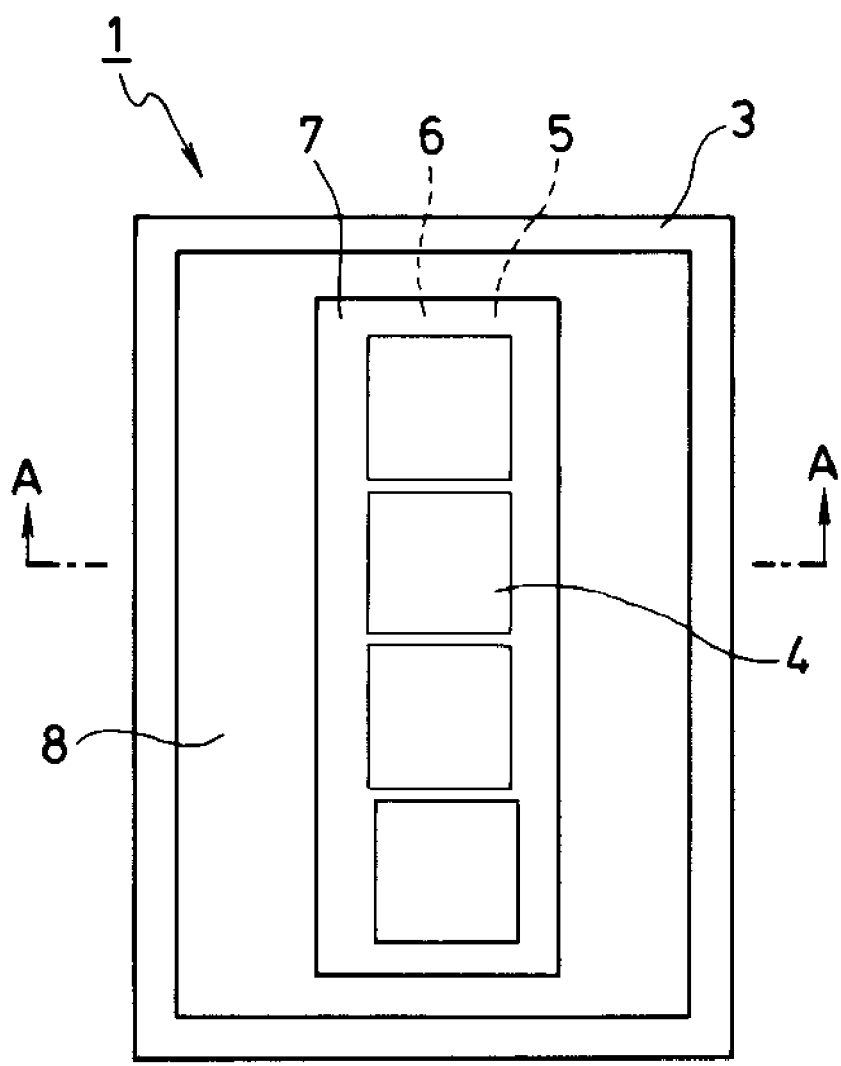
FIG. 1 is a top view showing an exemplary embodiment of a semiconductor light-emitting device made in accordance with principles of the disclosed subject matter.
Figure 2:
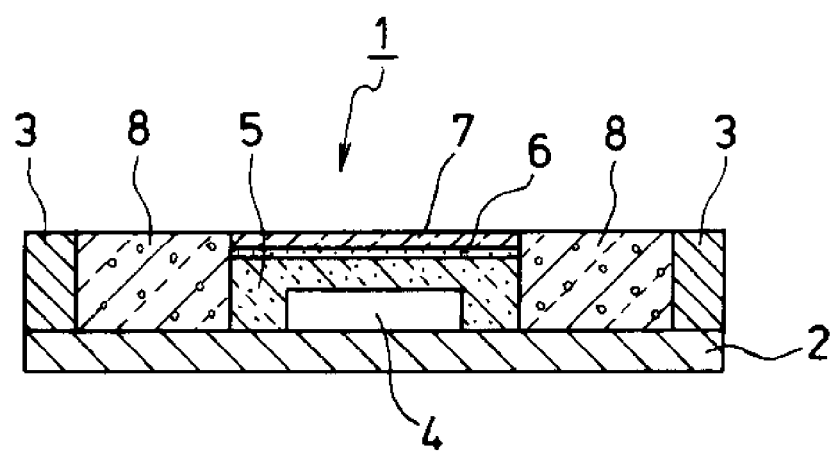
FIG. 2 is a cross-section view depicting the semiconductor light-emitting device taken along line A-A shown in FIG. 1.
Figure 3:
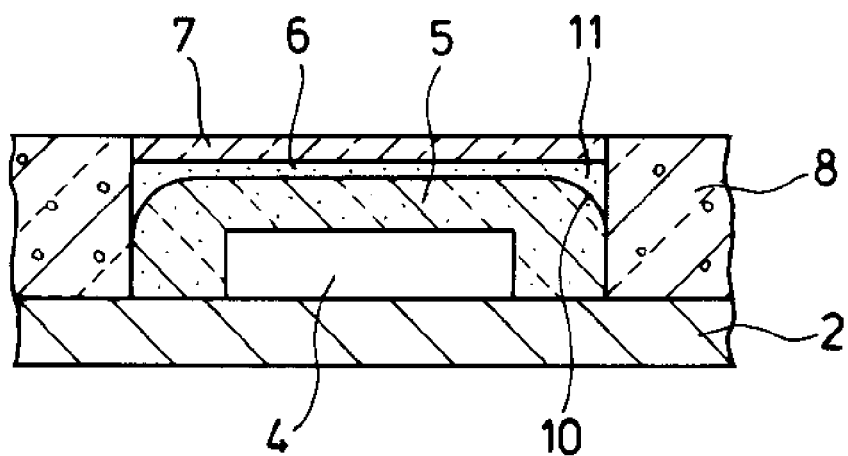
FIG. 3 is a partial close-up view depicting the semiconductor light-emitting device of FIG. 2.

Exemplary embodiments and manufacturing methods of the disclosed subject matter will now be described in detail with reference to FIGS. 1 to 7. FIG. 1 is a top view showing an exemplary embodiment of a semiconductor light-emitting device made in accordance with principles of the disclosed subject matter. FIG. 2 is a cross-section view depicting the semiconductor light-emitting device taken along line A-A shown in FIG. 1, and FIG. 3 is a partial close-up view of the semiconductor light-emitting device of FIG. 2.

The semiconductor light-emitting device 1 can include: a base board 2 having a mounting surface and conductor patterns formed on the mounting surface; at least one semiconductor light-emitting chip 4 having chip electrodes mounted on the mounting surface of the base board 2, and each of the chip electrodes electrically connected to respective conductor patterns of the base board 2; a wavelength converting layer 5 formed around the semiconductor light-emitting chip 4 so as to encapsulate the semiconductor light-emitting chip 4 along with the base board 2; a transparent adhesive layer 6 formed on the wavelength converting layer 5; a transparent plate 7 having a light incoming surface and a light outgoing surface and disposed on the transparent adhesive layer 6 so that the incoming surface of the transparent plate 7 contacts the transparent adhesive layer 6; a frame 3 located along an outer circumference of the base board 2 so as to surround the wavelength converting layer 5 and the transparent plate 7; and a diffusing reflection member 8 disposed between the frame and side surfaces of the wavelength converting layer 5, the transparent adhesive layer 6 and the transparent plate 7 tightly contacting the side surfaces of the wavelength converting layer 5.

Figure 4A:
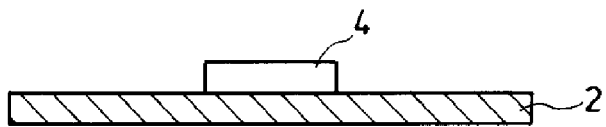
FIGS. 4a to 4f are cross-section views showing an exemplary manufacturing process for the semiconductor light-emitting device made in accordance with principles of the disclosed subject matter.

A manufacturing method for the semiconductor light-emitting device 1 will now be described in detail with reference to FIGS. 4a to 4f. FIG. 4a shows a process (a) for mounting the semiconductor light-emitting devices 4 on the mounting surface of the base board 2. The base board 2 can be composed of an insulating material such as a ceramic and the like, and conductor patterns can be formed on the mounting surface of the base board 2. The semiconductor light-emitting chip 4 can be mounted on one of the conductor patterns of the base board 2.

In this case, when the semiconductor light-emitting chip 4 is a chip of a wire bonding type, each of the chip electrodes can be electrically connected to the respective conductor patters via at least one of a bonding wire and a solder. When the semiconductor light-emitting chip 4 is a flip chip type chip, each of the chip electrodes can be electrically connected to the respective conductor patters of the mounting surface via a solder bump while the semiconductor light-emitting chip 4 is mounted on the conductor patterns of the base board 2. In this case, a plurality of semiconductor light-emitting chips can be mounted as the semiconductor light-emitting chip 4 onto a plurality of conductor patterns of the base board 2, and each of chip electrodes of the semiconductor light-emitting chips can be electrically connected to respective conductor patterns of the base board 2 in series or in parallel.

Figure 4B:
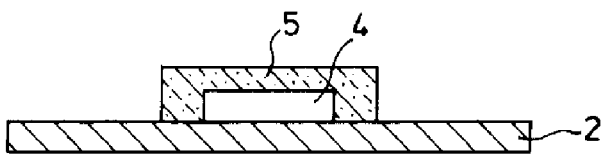

FIG. 4b shows a process (b) for forming the wavelength converting layer 5 around the semiconductor light-emitting chip 4. The wavelength converting layer 5 can be formed around the semiconductor light-emitting chip 4 by a stencil printing method and the like so as to encapsulate the semiconductor light-emitting chip 4 along with the base board 2. Then the wavelength converting layer 5 can be solidified by heat to maintain a shape thereof. The wavelength converting layer 5 can be made by dispersing at least one phosphor into a transparent resin such as a silicone resin, etc.

To form the wavelength converting layer 5, a viscosity modifier such as silica and the like and a light diffusing material such as titanium oxide, alumina and the like can be dispersed into the above-described silicone resin and the phosphor. The wavelength converting layer 5 can be formed around the semiconductor light-emitting chip 4 to encapsulate the semiconductor light-emitting chip 4 along with the base board 2 by a forming method such as a potting method and the like besides the printing method.

The phosphor can be excited by light emitted from the semiconductor light-emitting chip 4, and can emit a wavelength-converted light. Accordingly, the semiconductor light-emitting device 1 can emit a different wavelength from that of the semiconductor light-emitting chip 4 by an additive color mixture of a part of the light emitted from the semiconductor light-emitting chip 4 and the wavelength-converted light excited by another part of the light.

In this case, a color tone of light emitted from the semiconductor light-emitting device 1 can be adjusted by varying a density of the phosphor in the wavelength converting layer 5. Therefore, the semiconductor light-emitting device 1 can emit light having a prescribed color tone by adjusting a mixing ratio of the light emitted from the semiconductor light-emitting chip 4 and a wavelength-converted light emitted from the at least one phosphor.

Figure 4C:
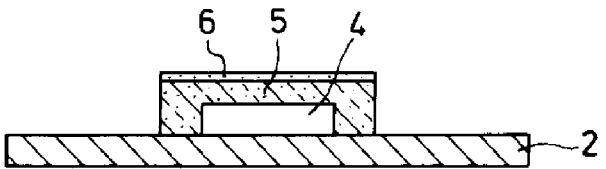

FIG. 4c shows a process (c) for forming the transparent adhesive layer 6 on the wavelength converting layer 5. The transparent adhesive layer 6 can be formed on the wavelength converting layer 5 encapsulating the semiconductor light-emitting chip 4. As the transparent adhesive layer 6, a transparent adhesive material having a low viscosity, a high liquidity and a high translucency can be used. The process (c) can be abbreviated as described later in this document.

Figure 4D:
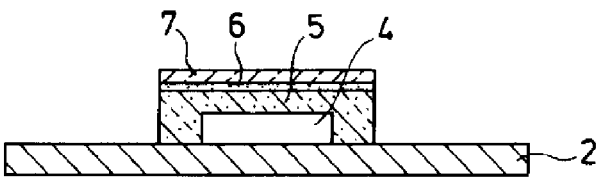

FIG. 4d shows a process (d) for attaching the transparent plate 7 on the wavelength converting layer 5 via the transparent adhesive layer 6. The transparent plate 7 can be attached on the wavelength converting layer 5 by placing the transparent plate 7 on the transparent adhesive layer 6. As the transparent plate 7, an inorganic material such as a resin material and the like and an organic material such as a glass and the like can be used.

The glass has a high transmission and a high heat resistance, and therefore can be used especially when a high power semiconductor chip is used as the semiconductor light-emitting chip 4, because a large amount of heat may be generated from the high power semiconductor chip. As the glass material, a low alkali glass such as D263 and the like and an alkali-free glass such as AF45 and the like can be used. In addition, quartz, sapphire and the like can also be used in general.

Figure 4E:
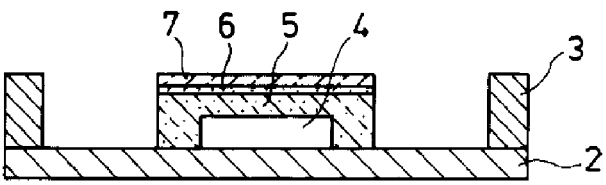

FIG. 4e shows a process (e) for attaching the frame 3 on the mounting surface of the base board 2. The frame 3 can be attached on the outer circumference of the mounting surface of the base board 2 via an adhesive material so as to surround the semiconductor light-emitting device 4, the wavelength converting layer 5 and the transparent plate 7, which is attached to the wavelength converting layer 5 via the transparent adhesive layer 6. The process (e) for attaching the frame 3 can also be carried out in the prior process, for example, the wavelength converting layer 5 and the frame 3 can be solidified and attached onto the mounting surface of the base board 2 in the same step by attaching the frame 3 after the process (b) is completed.

Figure 4F:
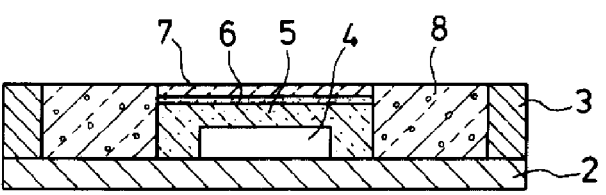

FIG. 4f shows a process (f) for disposing the diffusing reflection member 8. In the disposing process, the diffusing reflection member 8 can be disposed between the frame 3 and side surfaces of the wavelength converting layer 5, the transparent adhesive layer 6 and the transparent plate 7 while tightly contacting the whole side surfaces of the wavelength converting layer 5, the transparent adhesive layer 6 and the transparent plate 7. The diffusing reflection member 8 can be made by dispersing a light diffusing material such as titanium oxide, aluminum oxide and the like into a silicone resin.

The diffusing reflection member 8 can be disposed up to the light outgoing surface of the transparent plate 7, which is located on an opposite side to the transparent adhesive layer 6. The diffusing reflection member 8 can be composed of a light diffusing material having a high thixotrophy. The diffusing reflection member 8 can also be disposed by using a liquidity thereof and an interface phenomenon so as to tightly contact with the whole side surface of the wavelength converting layer 5, the transparent adhesive layer 6 and the transparent plate 7.

Four functions of the transparent adhesive layer 6 will now be described. A first function is the function of preventing the diffusing reflection member 8 from flowing onto a top edge portion of the wavelength converting layer 5 in the process (f) shown in FIG. 4f. In the process (b) shown in FIG. 4b, the top edge portion of the wavelength converting layer 5 may be curved. In this case, even when the top edge portion is curved, the transparent adhesive layer 6 can be filled at a concave portion 11 of the top edge portion of the wavelength converting layer 5 as shown in FIG. 3.

Thereby, the transparent adhesive layer 6 located at the concave portion 11 can prevent the diffusing reflection member 8 from flowing at the top edge portion of the wavelength converting layer 5 in the process (f) for disposing the diffusing reflection member 8. Thus, the diffusing reflection member 8 can tightly contact the side surfaces of the wavelength converting layer 5, the transparent adhesive layer 6 and the transparent plate 7 on the substantially same plane without a bump, which is located substantially perpendicular to the mounting surface of the base board 2.

A second function of the transparent adhesive layer 6 is the function of forming a boundary between the transparent adhesive layer 6 and the light incoming surface of the transparent plate 7 in the substantially same shape as the wavelength converting layer 5 when viewed from the light outgoing surface of the transparent plate 7. When the transparent plate 7 is placed on the transparent adhesive layer 6 in the process (d), the transparent adhesive layer 6 can expand wholly underneath the transparent plate 7 by surface tension thereof. Accordingly, the transparent adhesive layer 6 can form the boundary between the transparent adhesive layer 6 and transparent plate 7 in the substantially same shape as the wavelength converting layer 5.

A third function of the transparent adhesive layer 6 is the function of attaching the transparent plate 7 onto the wavelength converting layer 5 via the transparent adhesive layer 6 so as not to generate bubbles in the transparent adhesive layer 6 during the process (d). When the transparent plate 7 is attached on the wavelength converting layer 5 via the transparent adhesive layer 6 that is made of an adhesive material having a high liquidity (low viscosity), the transparent plate 7 can sink into the transparent adhesive layer 6 by its own weight or by the application of pressure, and a space of the transparent adhesive layer 6 between the transparent plate 7 and the wavelength converting layer 5 can become thin.

Accordingly, the adhesive material having a high liquidity can enter into the narrow space by a function of an interface phenomenon based on a capillary action, and thereby bubbles can be pushed outside. Therefore, the transparent adhesive layer 6 can have the function of attaching the transparent plate 7 on the wavelength converting layer 5 so as not to generate bubbles in the transparent adhesive layer 6.

A fourth function of the transparent adhesive layer 6 is a self-alignment function of the transparent plate 7 such that an outer shape of the transparent plate 7 overlaps with that of the wavelength converting layer 5 just above the wavelength converting layer 5. In this case, when the transparent plate 7 is lightweight enough to receive an effect of surface tension by the transparent adhesive layer 6; and the outside shape of the transparent plate 7 is substantially equal to that of the wavelength converting layer 5; and when a volume of the transparent adhesive layer 6 is large enough to receive the effect of surface tension, the transparent plate 7 can be aligned with the wavelength converting layer 5 via the transparent adhesive layer 6 just above the wavelength converting layer 5 by the self-alignment function so that each outer shape of the wavelength converting layer 5 and the transparent plate 7 overlaps with respect to each other.

In contrast, the self-alignment function of the transparent plate 7 can be eliminated by controlling the viscosity of the adhesive material of the transparent adhesive layer 6, the volume of the transparent adhesive layer 6, and affinities between the above-described members, etc. Thereby, the alignment between the wavelength converting layer 5 and the transparent plate 7 can also be mechanically carried out without the self-alignment function.

In the adhesive material of the transparent adhesive layer 6, a light diffusing material such as titanium oxide and the like and a phosphor material can be mixed. A silicone resin can be used as the adhesive material of the transparent adhesive layer 6 because silicone resin has a high heat resistance property, a high light resistance, a clear transparence and a tight sealing property and a viscosity of the silicone resin can be easily adjusted.

When the transparent plate 7 is attached on the wavelength converting layer 5 via the transparent adhesive layer 6, the transparent plate 7 can be mounted on the transparent adhesive layer 6 before the wavelength converting layer 5 is completely solidified, and the transparent plate 7 can adhere to the wavelength converting layer 5 while pressing the transparent plate 7 toward the wavelength converting layer 5. In this case, a distance between the transparent plate 7 and the semiconductor light-emitting chip 4 can be adjusted by changing the pressure applied to the transparent plate 7.

In addition, the wavelength converting layer 5 can be softened by using an adhesive material having a low viscosity or by decreasing a thickener in the wavelength converting layer 5. In this case, because the wavelength converting layer 5 has an appropriate liquidity, the transparent adhesive layer 6 can be eliminated and thus, the transparent plate 7 can be directly attached on the wavelength converting layer 5 without the transparent adhesive layer 6. Even when the transparent adhesive layer 6 is eliminated, because the wavelength converting layer 5 can spread underneath the transparent plate 7, the concave portion 11 caused at the top edge portion of the wavelength converting layer 5 can be reduced.

The exemplary embodiments of the semiconductor light-emitting device 1 will now be described in more detail. Aluminum nitride having a high thermal conductivity and the like can also be used as the base board 2, and conductor patterns composed of a metal can be formed on the mounting surface of the base board 2. Four flip chip type LED chips can be mounted as the semiconductor light-emitting chip 4 on the respective conductor patterns of the base board 2 via Au (gold) bumps in a linear fashion as shown in FIG. 1.

The wavelength converting layer 5 that is made by mixing a yellow phosphor with a silicone resin including a thickener in order to keep a thixotrophy can be formed around the four LED chips by a stencil printing method so as to encapsulate the four LED chips along with the base board 2. Then, the wavelength converting layer 5 can be solidified by heating it at an appropriate temperature.

In this case, the LED chips can be blue LED chips having a peak wavelength of 460 nanometers. The yellow phosphor can emit a yellow light upon being excited by blue light emitted from the blue LED chips. The semiconductor light-emitting device 1 can emit substantially white light having a color temperature of approximately 5,000K by an additive color mixture of the excited yellow light emitted from the yellow phosphor and a part of the blue light emitted from the blue LED chips.

As the yellow phosphor, $Y_3Al_5O_{12}$: $Ce^{3+}$ (YAG), $(Sr,Ba)_2SiO_4$:$Eu^{2+}$, $Ca_x(Si,Al)_{12}(O,N)_{16}$: $Eu^{2+}$ and the like can be used. In place of the yellow phosphor, a red phosphor wavelength-converting the blue light emitted from the blue LED chips into red-purple light and a green phosphor wavelength-converting the blue light into blue-green light can also be used. In this case, the semiconductor light-emitting device 1 can emit light having substantially white light by an additive color mixture of the red-purple light emitted from the red phosphor that is excited by the blue light, the blue-green light emitted from the green phosphor that is excited by the blue light and a part of the blue light.

As the red phosphor, $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like can be used. $Y_3(Ga,Al)_5O_{12}$: $Ce^{3+}$, $Ca_3Sc_2Si_3O_{12}$: $Ce^{3+}$, $CaSc_2O_4$: $Eu^{2+}$, $(Ba,Sr)_2SiO_4$: $Eu^{2+}$, $Ba_3Si_6O_{12}N_2$: $Eu^{2+}$, $(Si,Al)_6(O,N)$: $Eu^{2+}$ and the like can be used as the green phosphor. As the semiconductor light-emitting chip 4, an LED of InGaN series that emits near-ultraviolet light having a wavelength of approximately 380 nanometers, a laser diode that emits ultraviolet light and the like can also be used.

In this case, in order to emit substantially white light, the at least one phosphor can include: a red phosphor wavelength-converting the ultraviolet light into red light; a green phosphor wavelength-converting the ultraviolet light into green light; and a blue phosphor wavelength-converting the ultraviolet light into blue light. $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like can be used as the red phosphor. $(Si,Al)_6(O,N)$: $Eu^{2+}$, $BaMgAl_{10}O_{17}$: $Eu^{2+}Mn^{2+}$, $(Ba,Sr)_2SiO_4$: $Eu^{2+}$ and the like can be used as the green phosphor. $(Sr,Ca,Ba,Mg)_{10}(PO_4)_6 C_{12}$: $Eu^{2+}$, $BaMgAl_{10}O_{17}$: $Eu^{2+}$, $LaAl(Si,Al)_6(N,O)_{10}$: $Ce^{3+}$ can be used as the blue phosphor.

The transparent plate 7 that is made of a low alkali glass of D263 can be attached on the above-described wavelength converting layer 5 via the transparent adhesive layer 6. The shape of the light outgoing surface of the transparent plate 7 can be substantially equal to that of a top surface of the wavelength converting layer 5. A thickness between the incoming surface and the outgoing surface of the transparent plate 7 can be, for example, 0.1 millimeters. According to this embodiment, the thickness of the transparent can be 0.2 millimeter or less in order to prevent a reduction of light transmission by the transparent plate 7.

The side surface of the transparent plate 7 can be substantially perpendicular to both the incoming surface thereof facing the transparent adhesive layer 6 and the outgoing surface thereof. The incoming and the outgoing surfaces of the transparent plate 7 can be substantially rectangular, and the light incoming surface can be located just above the wavelength converting layer 5 via the transparent adhesive layer 6 so as to overlap with the top surface of the wavelength converting layer 5 in substantially same shape with respect to each other.

At least one of the incoming surface and the outgoing surface of the transparent plate 7 can be configured with a microstructure to diffuse the light emitted from the semiconductor light-emitting chip 4. A microstructure such as a cone shape and the like can be formed in two-dimensional periodic structure or in a random structure. Thereby, light use efficiency of the semiconductor light-emitting chip 4 can improve.

The frame 3 can be formed from the same material as the base board 2, such as with aluminum nitride having a high thermal conductivity, ceramics, and the like. The frame 3 can be attached on the outer circumference of the mounting surface of the base board 2 via the adhesive material so as to surround the semiconductor light-emitting chip 4, the wavelength converting layer 5 and the transparent plate 7 that is attached to the wavelength converting layer 5 via the transparent adhesive layer 6. A top surface of the frame 3 can be the substantially same level as the light outgoing surface of the transparent plate 7 (that is, aligned with or co-planar with the light outgoing surface).

The diffusing reflection member 8 having a liquidity that is made by dispersing a diffusing material such as titanium oxide into a silicone resin can be disposed between the frame 3 and both the wavelength converting layer 5 and the transparent plate 7, which is located on the wavelength converting layer 5 via the transparent adhesive layer 6. A top surface of the diffusing member 8 can be formed at substantially the same level as the outgoing surface of the transparent plate 7 (that is, substantially aligned with or co-planar with the outgoing surface of the transparent plate). Consequently, the semiconductor light-emitting device 1 can be constructed so that both top surfaces of the diffusing member 8 and the frame 3 and the outgoing surface of the transparent plate 7 become the substantially same level (aligned).

Figure 5:
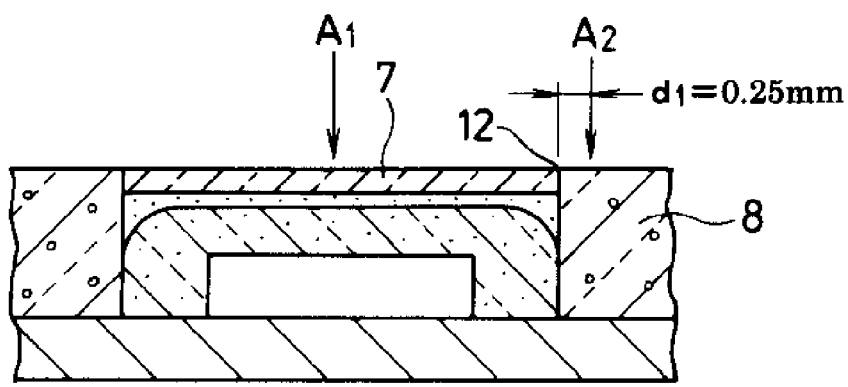
FIG. 5 is a cross-section view showing measurement points in the semiconductor light-emitting device of FIG. 1.
Figure 8:
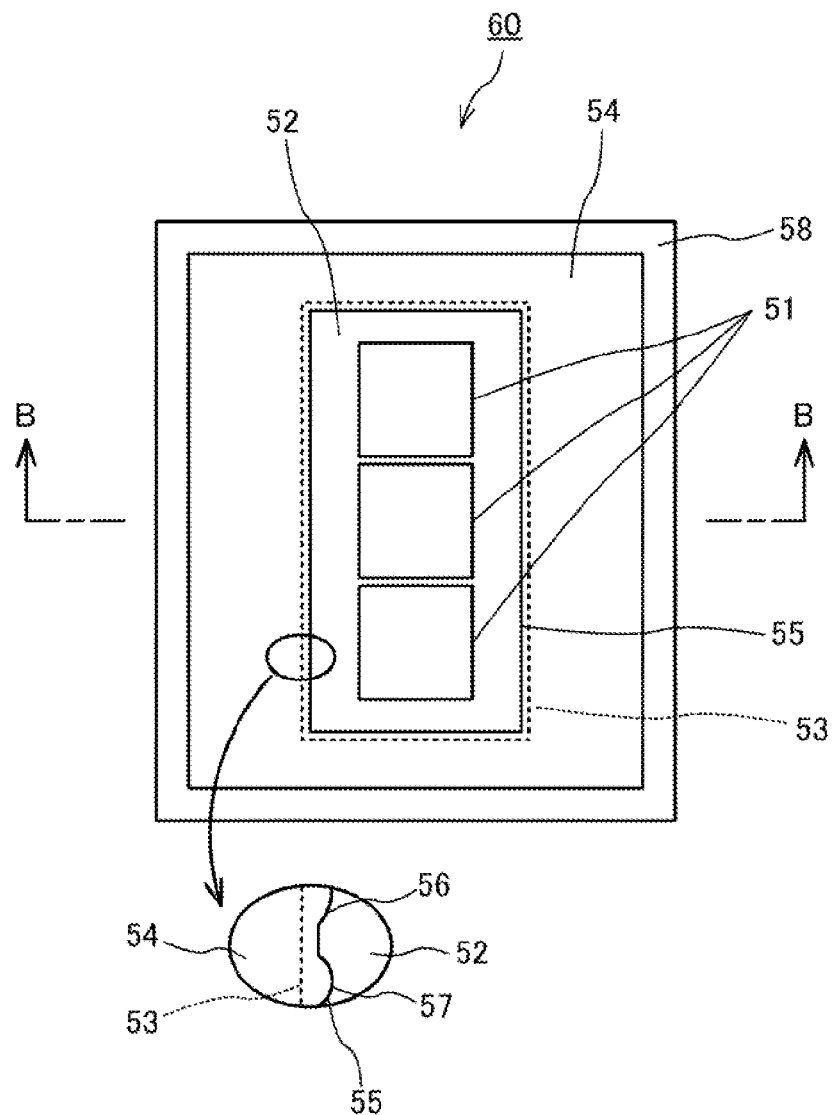
FIG. 8 is a top view showing a conventional semiconductor light-emitting device.
Figure 9:
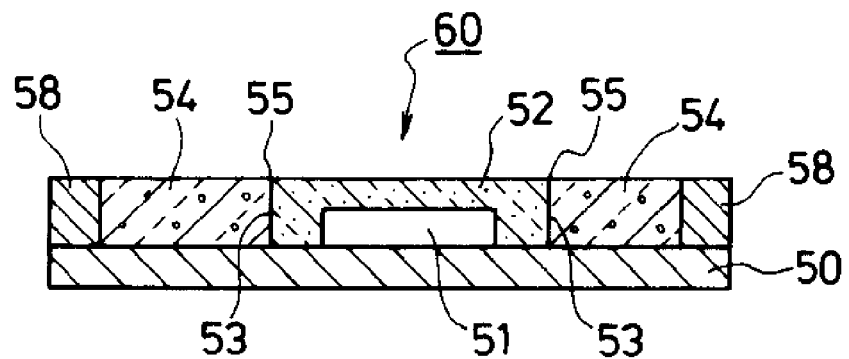
FIG. 9 is a cross-section view depicting the conventional semiconductor light-emitting device taken along line B-B shown in FIG. 8.
Figure 10:
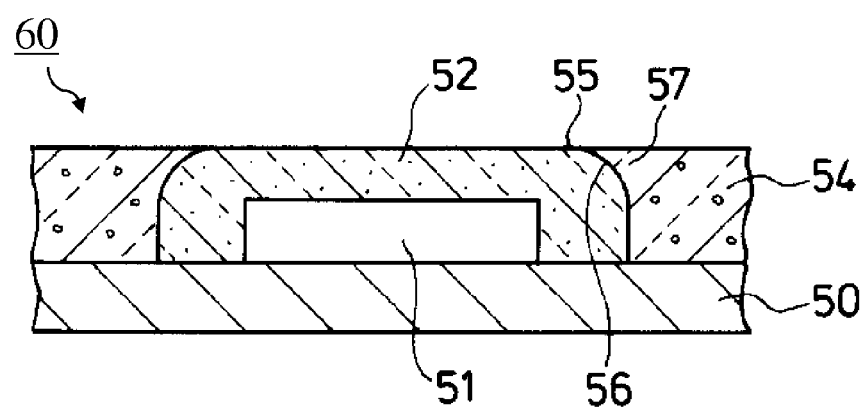
FIG. 10 is a partial close-up cross-section view depicting a portion of the conventional semiconductor light-emitting device of FIG. 9.

Optical characteristics of the above-described semiconductor light-emitting device 1 and the conventional semiconductor light-emitting device 60 shown in FIG. 8 to FIG. 10 have been empirically investigated. A result of the investigation will now be described. FIG. 5 is an explanatory cross-section view showing measurement points in the semiconductor light-emitting device 1, and FIG. 6 is an explanatory cross-section view showing measurement points in the conventional semiconductor light-emitting device.

Blue LED chips are used as the semiconductor light-emitting chips 4 and 51, and the yellow phosphor and the silicone resin are used as the wavelength converting layers 5 and 52. A silicone resin is used as the transparent adhesive layer 6, and a low alkali glass of D263 is used as the transparent plate 7. As for the remaining materials, the same materials are used in the semiconductor light-emitting device shown in FIG. 5 and the conventional device shown in FIG. 6.

A maximum light intensity occurs at a position A1 in FIG. 5 and this light intensity is denoted as a1. A position that is 0.25 millimeters away from a boundary 12 between the transparent plate 7 and the diffusing reflection member 8 is defined as A2. Thus, the light intensity at the position A2 is defined as a2. In this case, a measurement result of a2/a1 is 1.11 percent.

Figure 6:
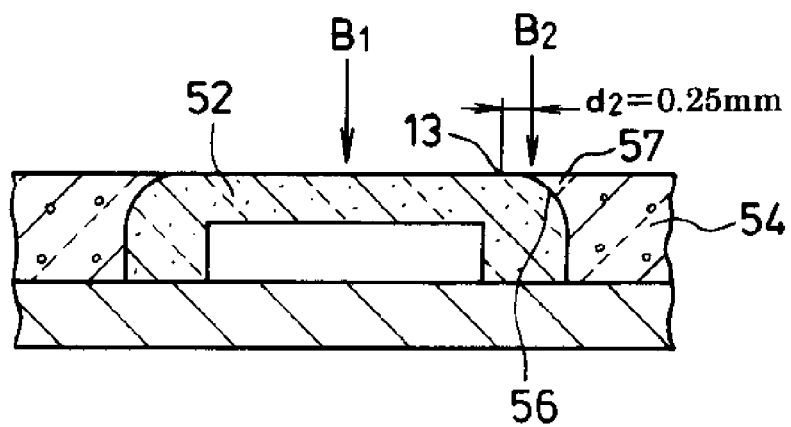
FIG. 6 is a cross-section view showing measurement points in a conventional semiconductor light-emitting device.

On the other hand, referring to the conventional device of FIG. 6, a maximum light intensity occurs at a position B1 which is defined as b1. A position that is 0.25 millimeters away from a boundary 13 between the wavelength converting layer 52 and the reflecting member 54 is defined as B2. Here, light intensity at the position B2 is defined as b2. In this case, a measurement result of b2/b1 is 1.42 percent.

Thus, the ratio of the light intensity measured at point 13 to the maximum light intensity in the conventional device is 1.42 percent and the ratio of the light intensity measured at the point 12 to the maximum light intensity of the semiconductor light-emitting device made in accordance with the disclosed subject matter is 1.11 percent. This illustrates the fact that this exemplary embodiment of a semiconductor light-emitting device of the disclosed subject matter can improve the light intensity ratio more than 20 percent over the conventional devices.

Figure 7:
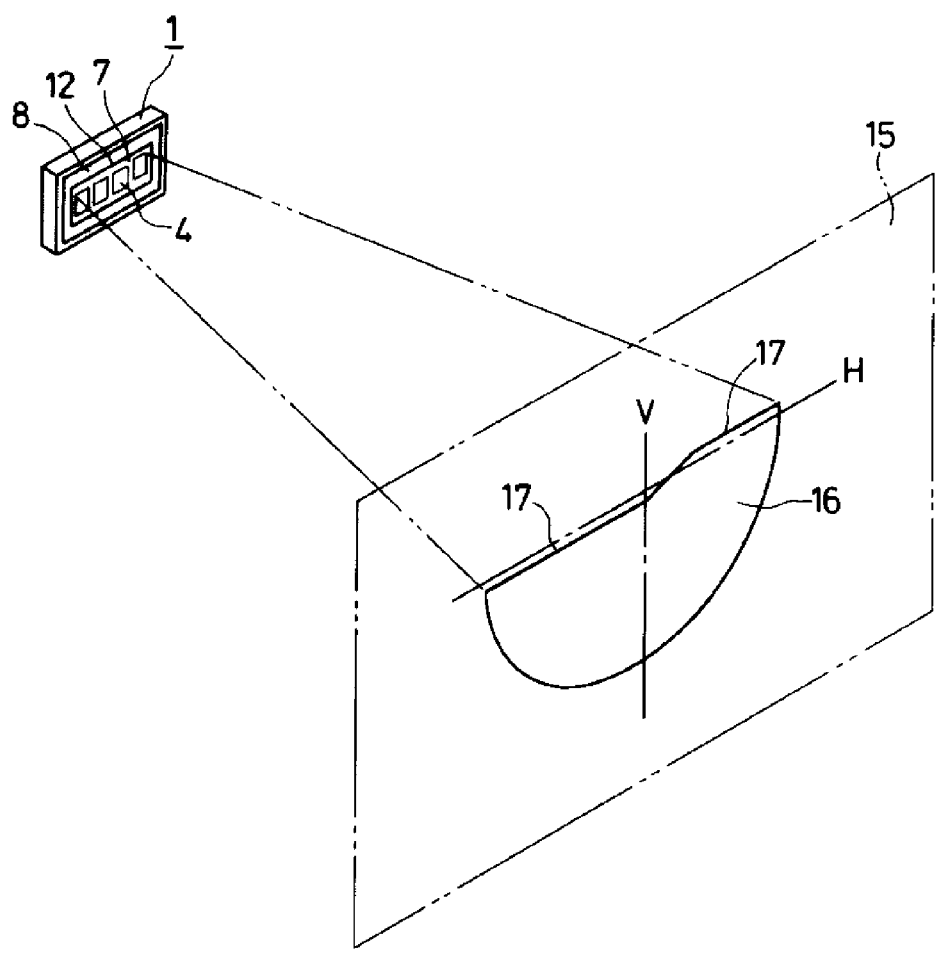
FIG. 7 is an explanatory diagram showing a light distribution pattern for a low beam by a headlight using the semiconductor light-emitting device of FIG. 1.

Thus, the deformation caused near the boundary 12 between the wavelength converting layer 5 and the diffusing reflection member 8 can improve by using the transparent plate 7, and the linearity of the boundary 12 can also improve. FIG. 7 is an explanatory diagram showing a light distribution pattern for a low beam by a projector headlight using the semiconductor light-emitting device 1.

The projector headlight can include a projector lens (not shown in FIG. 7) in front of the semiconductor light-emitting device 1 so that the outgoing surface of the transparent plate 7 and the diffusing reflection member 8 faces the projector lens. The headlight can form a light distribution pattern 16 on a vertical screen, which is vertically located in front of the headlight, and a horizontal cut-off line 17 having a high linearity and a high contrast for a low beam can be formed by the boundary 12 between the wavelength converting layer 5 and the diffusing reflection member 8.

As described above, the disclosed subject matter can reduce the deformation that may be caused by the boundary 12 between the wavelength converting layer 5 and the diffusing reflection member 8, and can improve the linearity of the boundary 12. Thus, the disclosed subject matter can provide a semiconductor light-emitting device used for a projector headlight having a favorable light distribution pattern for a low beam without a reflector and/or the shade.

In addition, the transparent plate 7 can be attached on the wavelength converting layer 5 using its own weight by placing it on the transparent adhesive layer 5. The wavelength converting layer 5 and the diffusing reflection member 8 can be solidified by a similar method as compared to conventional processes. Thus, the method of the disclosed subject matter can provide a semiconductor light-emitting device capable of being used as a projector headlight using manufacturing machines that are similar to those used to manufacture conventional semiconductor light-emitting devices.

Furthermore, the above-described embodiments are described as a light source device for a projector headlight. However, the semiconductor light-emitting device can incorporate various colored lights by combining the above-described semiconductor chip with the wavelength converting layer 5 including the at least one phosphor, and therefore can also be used as a light source device for various applications such as general lighting, a street light, stage lighting, traffic lights, etc.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
   a base board having a mounting surface and a conductor pattern located on the mounting surface;
   at least one semiconductor light-emitting chip including chip electrodes, each of the chip electrodes electrically connected to a respective portion of the conductor pattern of the base board;
   a wavelength converting layer having a top surface and a side surface, the wavelength converting layer including at least one phosphor in a transparent resin, the wavelength converting layer disposed around the at least one semiconductor light-emitting chip so as to encapsulate the at least one semiconductor light-emitting chip and at least a portion of the base board;
   a transparent plate having a side surface, an incoming surface, and an outgoing surface, the transparent plate disposed over the wavelength converting layer, the incoming surface of the transparent layer contacting the wavelength converting layer, the side surface of the transparent plate being substantially aligned with the side surface of the wavelength converting layer and being substantially perpendicular to the mounting surface of the base board;
   a frame located adjacent the mounting surface of the base board so as to surround the wavelength converting layer and the transparent plate; and
   a diffusing reflection member having a top surface located between the frame and both the side surface of the wavelength converting layer and the side surface of the transparent plate, wherein the top surface of the diffusing reflection member is configured to be substantially aligned with the outgoing surface of the wavelength converting layer.

2. The semiconductor light-emitting device according to claim 1, further comprising:
   a transparent adhesive layer having a side surface located between the wavelength converting layer and the transparent plate, wherein the side surface of the transparent adhesive layer is substantially aligned with both the side surface of the wavelength converting layer and the side surface of the transparent plate.

3. The semiconductor light-emitting device according to claim 1, wherein the at least one semiconductor light-emitting chip is a blue light-emitting chip and the at least one phosphor of the wavelength converting layer is selected from the group consisting of a yellow phosphor, and two phosphors including a red phosphor layer and a green phosphor layer.

4. The semiconductor light-emitting device according to claim 2, wherein the at least one semiconductor light-emitting chip is a blue light-emitting chip and the at least one phosphor of the wavelength converting layer is selected from the group consisting of a yellow phosphor, and two phosphor including a red phosphor layer and a green phosphor layer.

5. The semiconductor light-emitting device according to claim 1, wherein the at least one semiconductor light-emitting chip is an ultraviolet light-emitting chip and the at least one phosphor of the wavelength converting layer includes at least one of a red phosphor, a green phosphor, and a blue phosphor.

6. The semiconductor light-emitting device according to claim 2, wherein the at least one semiconductor light-emitting chip is an ultraviolet light-emitting chip and the at least one phosphor of the wavelength converting layer includes at least one of a red phosphor, a green phosphor, and a blue phosphor.

7. The semiconductor light-emitting device according to claim 1, wherein the transparent plate is made of a glass.

8. The semiconductor light-emitting device according to claim 2, wherein the transparent plate is made of a glass.

9. The semiconductor light-emitting device according to claim 1, wherein a thickness between the incoming surface and the outgoing surface of the transparent plate is 0.2 millimeters or less.

10. The semiconductor light-emitting device according to claim 2, wherein a thickness between the incoming surface and the outgoing surface of the transparent plate is 0.2 millimeters or less.

11. The semiconductor light-emitting device according to claim 1, wherein the transparent resin of the wavelength converting layer includes a silicone resin.

12. The semiconductor light-emitting device according to claim 2, wherein the transparent resin of the wavelength converting layer and the transparent adhesive layer include a silicone resin.

13. The semiconductor light-emitting device according to claim 1, wherein at least one of the incoming surface and the outgoing surface of the transparent plate includes a microstructure configured to diffuse light emitted from the at least one semiconductor light-emitting chip.

14. The semiconductor light-emitting device according to claim 2, wherein at least one of the incoming surface and the outgoing surface of the transparent plate includes a microstructure configured to diffuse light emitted from the at least one semiconductor light-emitting chip.

15. A vehicle headlight including the semiconductor light-emitting device according to claim 3, further comprising:
   a projector lens located in front of the semiconductor light-emitting device so that the outgoing surface of the transparent plate and the top surface of the diffusing reflection member face the projector lens.

16. A vehicle headlight including the semiconductor light-emitting device according to claim 4, further comprising:
   a projector lens located in front of the semiconductor light-emitting device so that the outgoing surface of the transparent plate and the top surface of the diffusing reflection member face the projector lens.

17. A method for manufacturing the semiconductor light-emitting device according to claim 1, comprising:
provide the base board;
connecting each of the chip electrodes of the at least one semiconductor light-emitting chip to a respective portion of the conductor pattern of the base board;
forming the wavelength converting layer around the at least one semiconductor light-emitting chip;
attaching the transparent plate onto the wavelength converting layer while pressing the transparent plate toward the wavelength converting layer; and
disposing the diffusing reflection member between the frame and the side surface of both the wavelength converting layer and the transparent plate.

18. A method for manufacturing the semiconductor light-emitting device according to 2, comprising:
providing the base board;
connecting each of the chip electrodes of the at least one semiconductor light-emitting chip to a respective portion of the conductor pattern of the base board;
forming the wavelength converting layer around the at least one semiconductor light-emitting chip;

forming the transparent adhesive layer on the wavelength converting layer;
mounting the transparent plate onto the transparent adhesive layer; and
disposing the diffusing reflection member between the frame and the side surface of each of the wavelength converting layer, the transparent adhesive layer, and the transparent plate.

19. The method for manufacturing the semiconductor light-emitting device according to claim 17, wherein the at least one semiconductor light-emitting chip is a blue light-emitting chip and the at least one phosphor of the wavelength converting layer is selected from the group consisting of a yellow phosphor, and two phosphors including a red phosphor layer and a green phosphor layer.

20. The method for manufacturing a semiconductor light-emitting device according to claim 18, wherein the at least one semiconductor light-emitting chip is a blue light-emitting chip and the at least one phosphor of the wavelength converting layer is selected from the group consisting of a yellow phosphor, and two phosphors including a red phosphor layer and a green phosphor layer.

* * * * *